United States Patent
Cho

(10) Patent No.: US 9,168,642 B2
(45) Date of Patent: Oct. 27, 2015

(54) VACUUM CUP ASSEMBLY

(75) Inventor: Ho-Young Cho, Seoul (KR)

(73) Assignee: KOREA PNEUMATIC SYSTEM CO., LTD., Seoul (KR)

( * ) Notice: Subject to any disclaimer, the term of this patent is extended or adjusted under 35 U.S.C. 154(b) by 649 days.

(21) Appl. No.: 13/389,973

(22) PCT Filed: Jun. 29, 2010

(86) PCT No.: PCT/KR2010/004209
§ 371 (c)(1),
(2), (4) Date: Jan. 9, 2013

(87) PCT Pub. No.: WO2011/027968
PCT Pub. Date: Mar. 10, 2011

(65) Prior Publication Data
US 2013/0147101 A1    Jun. 13, 2013

(30) Foreign Application Priority Data

Sep. 1, 2009  (KR) .................. 10 2009 0081882

(51) Int. Cl.
   *B25B 11/00*   (2006.01)
   *B25J 15/06*   (2006.01)
   *B65G 47/91*   (2006.01)
   *H05K 13/04*   (2006.01)

(52) U.S. Cl.
   CPC ........... *B25B 11/005* (2013.01); *B25J 15/0616* (2013.01); *B65G 47/91* (2013.01); *H05K 13/0408* (2013.01)

(58) Field of Classification Search
   CPC ...... B25B 11/005; B25B 11/007; B25J 15/06; B25J 15/0616; B65G 47/91; B66C 1/02
   USPC ....................... 269/21; 294/183, 65
   See application file for complete search history.

(56) References Cited

U.S. PATENT DOCUMENTS

| 2,303,393 A | * | 12/1942 | Schmidt ..................... 294/186 |
| 3,102,751 A | | 9/1963 | Noble et al. |
| 3,223,442 A | | 12/1965 | Fawdry et al. |
| 3,704,038 A | * | 11/1972 | Glanemann ................. 294/65 |
| 4,129,328 A | | 12/1978 | Littell |
| 4,266,905 A | * | 5/1981 | Birk et al. .................. 414/627 |

(Continued)

FOREIGN PATENT DOCUMENTS

| DE | 10108845 A1 * | 8/2001 | ............ B65G 47/91 |
| JP | 05-9885 U | 2/1993 | |

(Continued)

*Primary Examiner* — Lee D Wilson
*Assistant Examiner* — Tyrone V Hall, Jr.
(74) *Attorney, Agent, or Firm* — Robert C. Klinger

(57) ABSTRACT

The present invention relates to a vacuum cup assembly designed to quickly and easily remove and mount a suction pad. The assembly comprises: a pipe-shaped body having a first passage for discharging air; a vacuum cup coupled to a lower end of the body; and a movable holder disposed between the body and the vacuum cup. Here, the vacuum cup includes a ring-shaped fastener, and a suction pad mounted on an outer surface flange of the fastener, wherein the holder resiliently presses and fixes the mounted suction pad against the fastener. Here, the inner space of the suction pad is in communication with the first passage of the body. The pressed and fixed state is negated when the holder is moved upwards, whereupon the suction pad can be easily removed and mounted.

7 Claims, 5 Drawing Sheets

(56) References Cited

U.S. PATENT DOCUMENTS

| | | | |
|---|---|---|---|
| 4,685,714 A | 8/1987 | Hoke | |
| 4,747,634 A * | 5/1988 | Hoke | 294/185 |
| 4,957,318 A | 9/1990 | Blatt | |
| 5,029,383 A * | 7/1991 | Snyder et al. | 29/740 |
| 5,135,276 A | 8/1992 | Blatt et al. | |
| 5,152,566 A | 10/1992 | Blatt et al. | |
| 5,172,922 A * | 12/1992 | Kowaleski et al. | 279/3 |
| 5,190,332 A * | 3/1993 | Nagai et al. | 294/189 |
| 5,193,776 A * | 3/1993 | Nagai et al. | 188/67 |
| 5,688,008 A * | 11/1997 | Hansch | 294/189 |
| 5,733,097 A | 3/1998 | Herbermann et al. | |
| 6,863,323 B2 | 3/2005 | Neveu | |
| 2003/0062735 A1 * | 4/2003 | Pabst | 294/64.1 |

FOREIGN PATENT DOCUMENTS

| | | |
|---|---|---|
| JP | 2005-28489 A | 2/2005 |
| KR | 10-2002-59344 A | 7/2002 |
| KR | 10-591059 B1 | 6/2006 |
| KR | 10-2006-114876 A | 11/2006 |
| WO | WO 01-08855 A1 | 2/2001 |

* cited by examiner

VACUUM CUP ASSEMBLY

TECHNICAL FIELD

The present invention relates, in general, to a vacuum cup for a vacuum transfer system which is designed to hold an article and, more particularly, to a vacuum cup assembly designed to quickly and easily remove and mount a suction pad.

BACKGROUND ART

A vacuum transfer system is a system in which a vacuum pump is actuated using compressed air so as to discharge air to the outside from the inside of a vacuum cup, thereby holding and transferring an article to a predetermined position using the resulting negative pressure. In this system, the vacuum cup is coupled with a separate pipe-shaped body to form a vacuum cup assembly, and is connected to the vacuum pump by means of the body.

FIG. 1 illustrates a conventional vacuum cup assembly 1. A vacuum cup 2 includes a ring-shape fastener having a flange 4 that protrudes outwards, and a flexible suction pad 5 which is joined to the side surface of the fastener while surrounding the flange 4. The fastener 3 is formed from a rigid material such as metal, plastic, etc., and the suction pad 5 is fixed to the fastener 3 by an adhesive or an insert-molding method.

The pipe-shaped body 6 is provided separately from the vacuum cup 2, and the fastener 3 of the vacuum cup 2 is coupled to a lower end of the body 6, thereby forming a vacuum cup assembly composed of the vacuum cup 2 and the body 6. Here, the inner space S of the suction pad 5 is in communication with a central passage 7 of the body 6. Thus, when the vacuum pump is actuated, the inside air of the vacuum cup 2 is evacuated and a negative pressure is concurrently created to hold an article in the inner space S.

Actually, the vacuum cup assembly 1 or vacuum cup 2 that has been used is the currently available one. However, after a period of use, the fatal problems occur of a gap partially forming between the fastener 3 and the suction pad 5 so that external air is introduced therethrough. Further, there are additional problems described below. It is assumed that such problems are the result of the method of joining the suction pad 5.

As well known in the art, the suction pad 5 is made of a flexible material such as silicone, urethane, rubber, etc. This material has improved adhesion or ability to create a seal with a smooth surface, so that it is applicable to a vacuum suction pad. On the contrary, that material also has the drawbacks of poor wear resistance and durability. Thus, damaged suction pads 5 frequently have to be replaced with new ones.

However, since the suction pad 5 was fixed in a joining manner as previously described, it could not be easily removed from or mounted to the fastener 3. In consideration of the structure, if the suction pad 5 is damaged, then the vacuum cup itself should be removed from the assembly 1. However, this causes the following problems:

First, despite the fastener 3 not having been damaged at all, the vacuum cup should be removed, causing monetary loss; and Second, particularly when the occupied space is small, it is difficult to remove and mount the vacuum cup 2.

It appears though that these problems can be resolved by excluding the defective joining method with respect to the suction pad 5 and adapting a 'fastening' method using such as a bolt or the like. However, also in this case, the vacuum cup 2 can by no means be easy to remove and mount. Moreover, since in a region where the fastening is performed, the pad is subjected to deformation or damage by the load of an article, this method is determined to be unsuitable to a field of vacuum technology. In fact, the fastening method using e.g. bolts has been used as a supplementary measure for the joining method.

DISCLOSURE

Technical Problem

The present invention proposes reasonable solutions to solve the above problems occurring in the vacuum cup or a vacuum cup assembly of the related art. An object of the present invention is to provide a vacuum cup assembly in which a suction pad is quickly removed and mounted.

Another object of the present invention is to provide a vacuum cup and an assembly thereof which is reliably used without the risk of introducing external air. Still another object of the present invention is to provide a vacuum cup and an assembly thereof which can be reliably used for a long period without the risk of a suction pad being damaged.

Technical Solution

In an aspect, the present invention provides a vacuum cup assembly including:

a pipe-shaped body having therein a first exhaust passage extending in a vertical direction;

a vacuum cup including a ring-shaped fastener coaxially coupled to a lower end of the body and having an outward flange on a side surface thereof, and a flexible suction pad having, on an upper end thereof, an inward flange seated on the outward flange, wherein the inner space of the suction pad is in communication with the first exhaust passage; and a holder being movable in a vertical direction and having a ring member disposed in such a manner as to come into contact with an upper surface of the inward flange of the suction pad, and an elastic member supported against the body at one end to elastically force the ring member to compress and fix the suction pad.

Preferably, a pipe-shaped ball joint is coupled to the lower end of the body, wherein the ball joint has a second passage therein. The fastener is rotatably coupled to the ball portion of the ball joint, wherein the inner space of the suction pad is put in communication with the first passage via the second passage.

Preferably, the holder is of a reversed 'L' type member designed to come into contact with an upper surface and side surface of the inward flange of the suction pad. The elastic member is a coil spring coaxially disposed to the outside of the body. More preferably, the coil spring is a conical spring having a width that increases downwards.

Advantageous Effects

According to the present invention, the flexible suction pad is fixed by means of the 'compressive' fixing method that uses the elasticity of a vertically-movable holder. This method provides several effects in a field of vacuum cup and assembly thereof:

First, the suction pad can be disassembled by simple manipulation of the holder, thereby performing easy removal and mounting of the suction pad as well.

Second, since there is no gap between the fastener and the suction pad, thereby forming a complete seal, there is no risk of external air being introduced into the vacuum cup.

Third, since an element such as a bolt that requires a mounting tool is not used, assembly is easy and the suction pad is prevented from being damaged.

In the preferred embodiments of the present invention, the vacuum cup assembly may be configured such that the vacuum cup can be rotated using the ball joint. Thus, the vacuum cup is increasingly well-adapted to the inclined surface of an article that has one.

Further, the shape of the reversed 'L' type holder surrounds the side surface of the suction pad, so that the suction pad can be more reliably and firmly held and maintained. Using the conical spring as the elastic member provides wider pressure distribution, contributing to providing a vacuum cup and a vacuum cup assembly that have stabilized balance.

DESCRIPTION OF REFERENCE SIGNS FOR MAJOR PARTS IN THE DRAWINGS

| 11. Body | 12. Vacuum cup |
| 13. Holder | 14. First passage |
| 16. Ball joint | 17. Second passage |
| 19. Ball portion | 20. Fastener |
| 23. Outward flange | 24. Suction pad |
| 25. Inward flange | 26. Ring member |
| 27. Elastic member | |

MODE FOR INVENTION

The above and other features and effects of the present invention will become more apparent from embodiments that will be described below with reference to the accompanying drawings.

Figure 1:
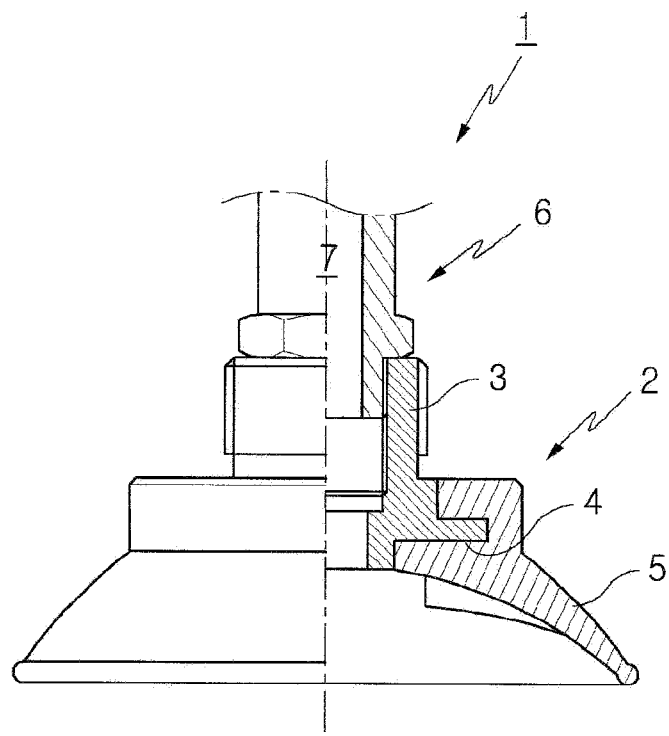
FIG. 1 is a view of a vacuum cup assembly of the related art.
Figure 2:
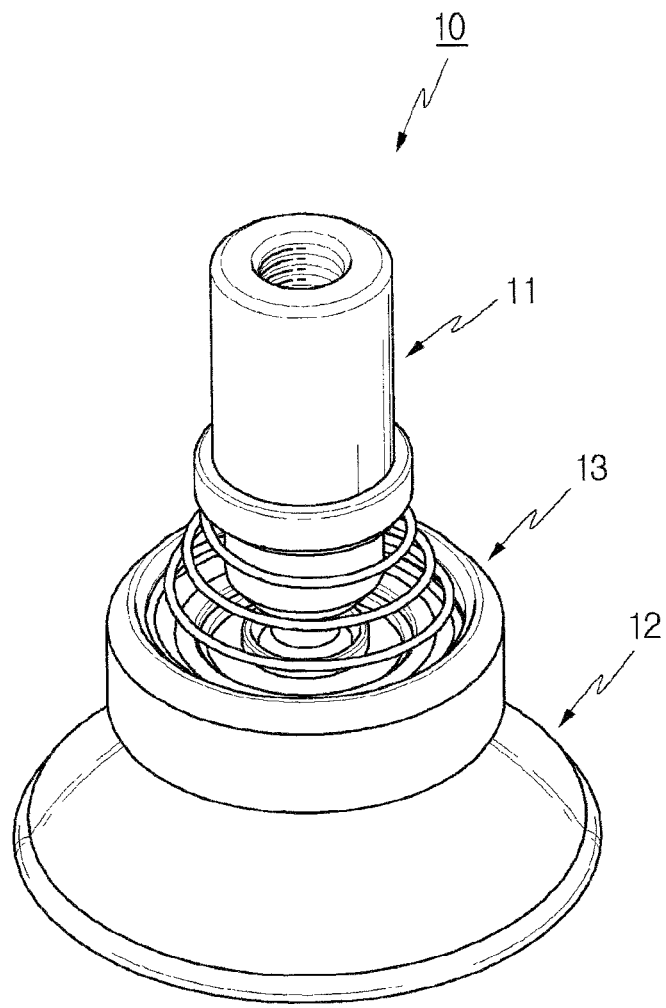
FIG. 2 is a perspective view of a vacuum cup assembly according to the present invention.
Figure 3:
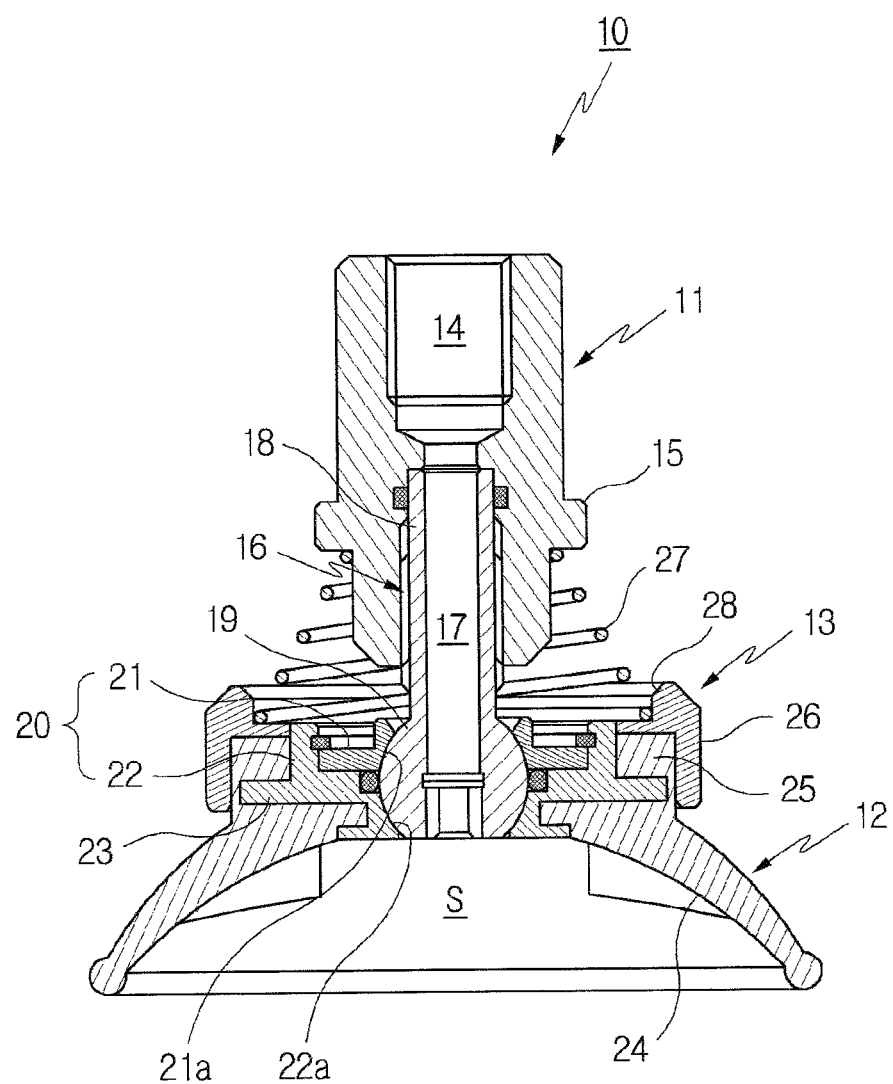
FIG. 3 is a cross-sectional view of the vacuum cup assembly of FIG. 2.

Referring to FIGS. 2 and 3, a vacuum cup assembly according to the present invention is designated by the reference sign 10. The vacuum cup assembly 10 includes a pipe-shaped body 11, a vacuum cup 12 coupled to a lower end of the body 11, and a holder 13 disposed between the body 11 and the vacuum cup 12.

The body 11 is a pipe-shape member having a first exhaust passage 14 therein that extends in a vertical direction. In a common vacuum transfer system, the passage 14 is connected to a suction port of a vacuum pump, and the body 11 is connected to a robot arm which is designed to be actuated according to a system control program. The body 11 is provided, on the outer surface thereof, with an annular protrusion 15, which facilitates mounting of a spring or other mechanical elements.

The first passage 14 of the body 11 is in communication with the inner space S of the vacuum cup 12, which is not influenced by a ball joint that will be described below.

The ball joint 16 is a pipe-shaped member having a second passage 17 therein, and is coupled to a lower end of the body 11. More specifically, the ball joint 16 integrally has a one coupling end 18 and a ball portion 19 opposite the coupling end. The ball joint is coupled to the body in such a manner that the coupling end 18 is inserted into the first passage 14 from the downstream side. Naturally, at this time, the ball portion protrudes downwards from the body 11, and the second passage 17 is made to communicate with the first passage 14.

In the present embodiment, the ball joint 16 is provided in order to allow the vacuum cup 12 to rotate in a simple way. Thus, in other embodiments which do not have such an object, the ball joint 16 and its peripheral will be omitted. In this case, the vacuum cup 12 will be directly coupled to the lower end of the body 11, whereupon the inner space S of the vacuum cup 12 communicates directly with the first passage 14.

The vacuum cup 12 includes a hollow type ring-shaped fastener 10 having an outward flange 23 on an outer surface, and a suction pad 24 having an inward flange 25 on the top, the inward flange being seated on the outward flange 23. The fastener 20 is coaxially coupled to the lower and of the body 11, preferably to the ball portion 19 of the ball joint 16 such that it is able to rotate.

The design, in specific, is such that the fastener 20 includes an upper structure 21 and a lower structure 22, wherein the upper structure has an inner surface 21a, the shape of which corresponds to that of an upper half part of the ball portion 19, and the lower structure has an inner surface 22a, the shape of which corresponds to that of a lower half part of the ball portion 19. The upper and lower structures 21 and 22 are put into contact with each other and coupled together while receiving the ball portion 19. Thus, the fastener 20 is coupled such that it is rotatable about the ball portion 19. Here, the inner space S of the suction pas 24 becomes communicated with the first passage 14 of the body 11 via the second passage 17 of the ball joint.

While the outward flange 23 has been illustrated to be formed on the lower structure 22, it can be formed on the upper structure 21 if needed. The suction pad 24, which is made of a flexible material, such as silicone, urethane, rubber, etc., having excellent adhesion and sealing features, is first engaged with the outward flange 23 of the fastener 20, and then is fixed to the fastener 20 in a 'compressive' manner by the structure of the holder 13 which will be described below.

The holder 13 includes a ring member 26 which is disposed in such a manner as to come into contact with the upper surface of the inward flange 25 seated on the outward flange, and an elastic member 27 which is vertically movable in such a manner as to be supported against the body 11 at one end so as to elastically compress the ring member 26. In the context of the structure, the inward flange 25 of the suction pad 24 is located between the ring member 26 and the outward flange 23, and is compressed by the elastic force applied to the ring member 26. Because of such a 'compressive' manner, the suction pad 24 is fixed to the fastener 20.

In a specific embodiment, the elastic member 27 is preferably a coil spring coaxially disposed around the body 11, more preferably a conical spring having a width increasing downwards. The coil spring as the elastic member 27 has the advantage of facilitating the vertical movement of the holder 13. In addition, the conical spring provides wider pressure distribution when compared to the common spring.

In a specific embodiment, the shape of the ring member 26 is designed to be of the reversed 'L' type such that it comes into contact with the upper and side surfaces of the inward flange 25. This shape is effective for the misalignment of the suction pad from its right position. Further, the ring member 26 has an upper protrusion 28 around the periphery, and the distal end of the coil spring 27 is supported by the upper protrusion 28. This structure is selected in order to prevent the spring 27 from being misaligned.

Figure 4:
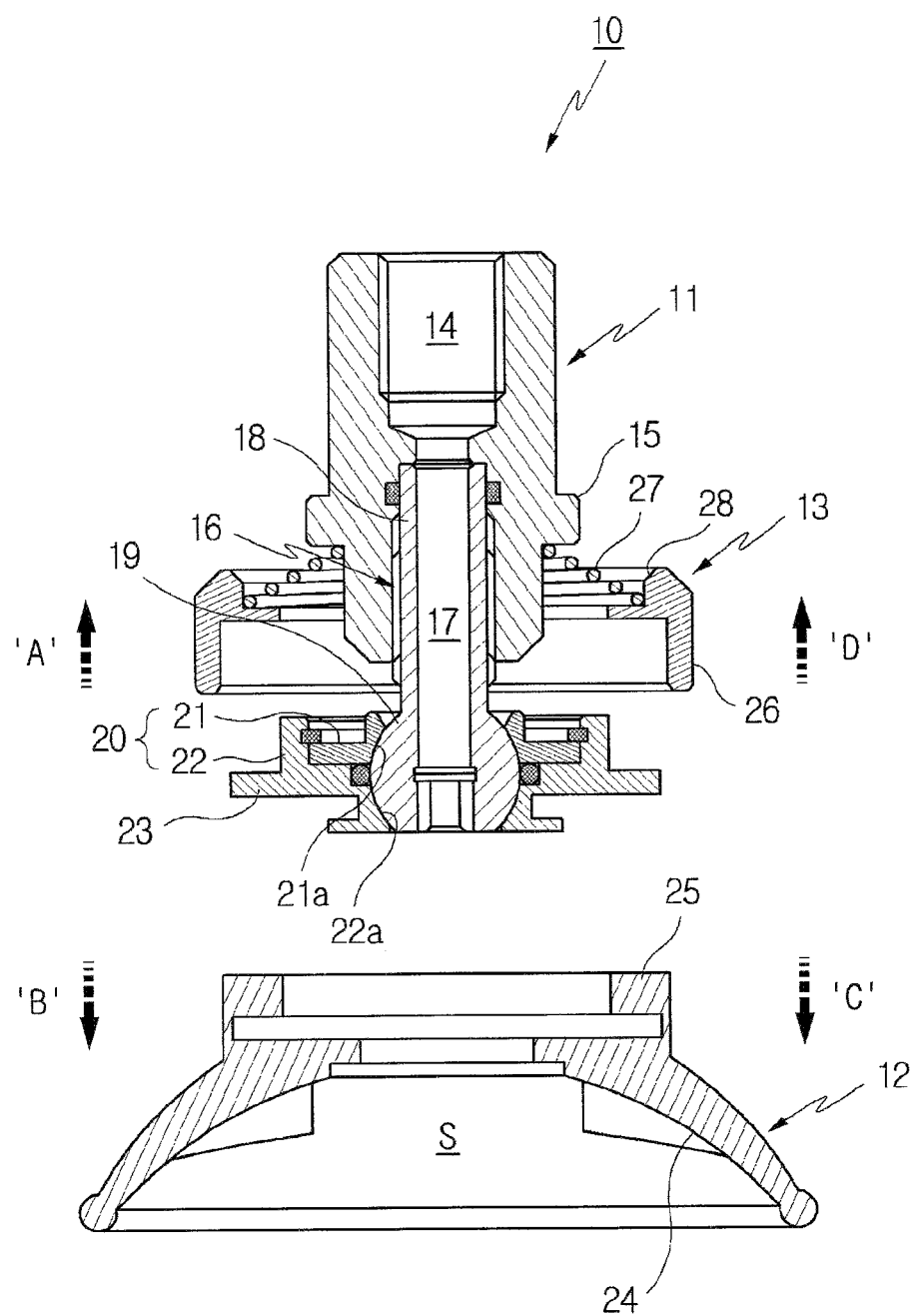
FIG. 4 is a view explaining the removal and mounting of a suction pad shown in FIG. 3.

As shown in FIG. 4, when the ring member 26 of the holder 13 is pulled up (in the direction of the arrow 'A') by hands, the compressive fixation of the suction pad is forcedly released. In this state, the suction pad 24 is merely hooked by the fastener 20. In the meantime, the suction pad 24 is formed from a flexible material. Thus, the suction pad 24 is easily removed from the fastener when the suction pad 24 is only pulled down (in the direction of the arrow 'B') by hand.

On the contrary, when the fastener is coupled to the suction pad 24 such that the outward flange 23 of the fastener is interlocked with the inward flange 25 of the suction pad 24 (in the direction of the arrow 'C'), and then the ring member 26 is mounted in the former sub-assembly (in the direction of the arrow 'D') such that it is moved down by the elastic member 27, and put in the state shown in FIG. 3, thereby the suction pad 24 is fixed in a 'compressive' manner. According to the vacuum cup assembly 10 having such a construction, it is possible to quickly and easily remove and mount the suction pad 24.

Figure 5:
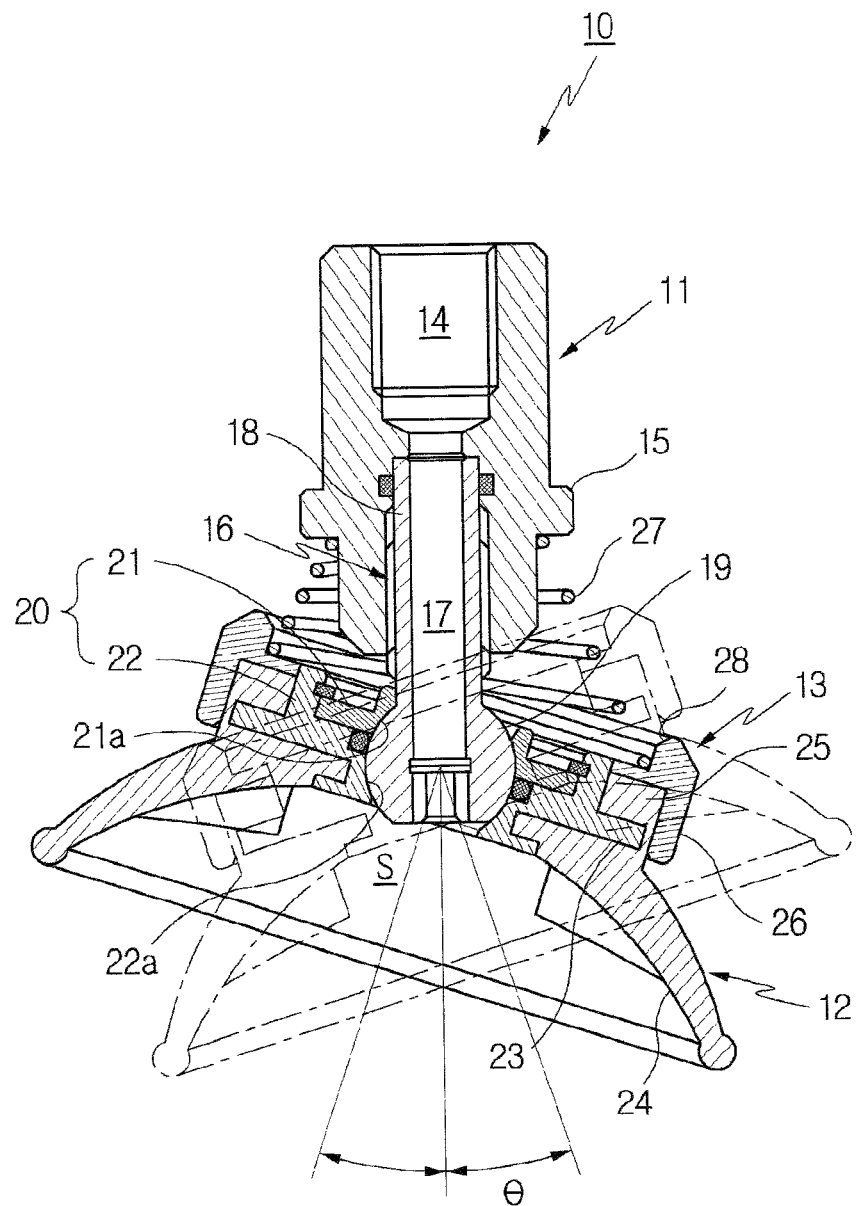
FIG. 5 is a view explaining the operation of the suction pad being removed and mounted.

Referring to FIG. 5, the vacuum cup 12 rotates about the body 11, particularly the ball portion 19 of the ball joint 16. Thus, the suction pad 24 of the vacuum cup 12 can be brought into easy, precise contact with an article even when the article assumes any posture or is positioned at an angle.

While the vacuum cup 12 is holding and transferring an article, the vacuum cup 12 swivels around the article under its own weight and that of the article. Here, the elastic member 27 of the holder 13 serves to restrict the excessive swivel action of the vacuum cup 12 and to maintain the balance so that the transferring action can be carried out in a safe manner. Also in this case, using the conical spring as the elastic member 27 provides wider pressure distribution, thereby allowing the vacuum cup 12 to become balanced more quickly.

The invention claimed is:

1. A vacuum cup assembly comprising:
   a pipe-shaped body having therein a first exhaust passage extending in a vertical direction;
   a vacuum cup including a ring-shaped fastener coaxially coupled to a lower end of the body and having an outward flange on a side surface thereof, and a flexible suction pad having, on an upper end thereof, an inward flange seated on the outward flange, wherein the inner space of the suction pad is in communication with the first exhaust passage; and
   a holder being movable in a vertical direction and having a ring member disposed in such a manner as to come into contact with an upper surface of the inward flange of the suction pad, and an elastic member supported against the body at one end to elastically force the ring member to compress and fix the suction pad.

2. The vacuum cup assembly according to claim 1, wherein a pipe-shaped ball joint is coupled to the lower end of the body, wherein the ball joint has a second passage therein, wherein the fastener is rotatably coupled to a ball portion of the ball joint, wherein the inner space of the suction pad is put in communication with the first passage via the second passage.

3. The vacuum cup assembly according to claim 2, wherein the fastener includes an upper structure and a lower structure, wherein the upper structure has an inner surface, the shape of which corresponds to that of an upper half part of the ball portion, and the lower structure has an inner surface, the shape of which corresponds to that of a lower half part of the ball portion, wherein the upper and lower structures are put into contact with each other and coupled together while receiving the ball portion, wherein the outward flange is selectively formed on either the upper structure or the lower structure.

4. The vacuum cup assembly according to claim 1, wherein the holder is a reversed 'L' type member designed to come into contact with an upper surface and a side surface of the inward flange of the suction pad.

5. The vacuum cup assembly according to claim 1, wherein the elastic member is a coil spring coaxially disposed to the outside of the body.

6. The vacuum cup assembly according to claim 5, wherein the coil spring is a conical spring having a width that increases downwards.

7. The vacuum cup assembly according to claim 5, wherein the ring member has an upper protrusion around the periphery, and the distal end of the coil spring is supported by the upper protrusion.

* * * * *